US 6,630,700 B2

(12) United States Patent
Kaatz

(10) Patent No.: US 6,630,700 B2
(45) Date of Patent: Oct. 7, 2003

(54) NMOS CIRCUIT IN ISOLATED WELLS THAT ARE CONNECTED BY A BIAS STACK HAVING PLURALIRTY OF DIODE ELEMENTS

(75) Inventor: Gary Kaatz, Barrington, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/972,274

(22) Filed: Oct. 5, 2001

(65) Prior Publication Data
US 2003/0067042 A1 Apr. 10, 2003

(51) Int. Cl.[7] .............................. H01L 29/76
(52) U.S. Cl. .............. 257/288; 257/158; 257/277; 257/278; 257/276; 257/544; 257/233
(58) Field of Search ............... 257/158, 277, 257/278, 76, 544, 233, 288

(56) References Cited

U.S. PATENT DOCUMENTS

| 6,111,282 A | 8/2000 | Gonzalez |
| 6,388,483 B1 * | 5/2002 | Mizuno et al. |
| 6,521,946 B2 | 2/2003 | Mosher |

OTHER PUBLICATIONS

Arvin R. Shahani, Derek K. Shaeffer, and Thomas H. Lee, A 12–mW Wide Dynamic Range CMOS Front–End for a Portable GPS Receiver, IEEE Journal of Solid–State Circuits, vol. 32, No. 12, Dec. 1997, pp. 2061–2070.

Ming–Jer Chen, Jih–Shin Ho, Tzuen–His Huang, Chuang–Hen Yang, Yeh–Ning Jou, and Terry Wu, Back–Gate Forward Bias Method for Low–Voltage CMOS Digital Circuits, IEEE Transactions on Electron Devices, vol. 43, No. 6, Jun. 1996, pp. 904–910.

Torsten Lehmann and Marco Cassia, 1–V Power Supply CMOS Cascode Amplifier, IEEE Journal of Solid–State Circuits, vol. 36, No. 7, Jul. 2001, pp. 1082–1086.

Chi–Nan Brian Li, Didier Farenc, Rana Singh, Jane Yater, Sarah Liu, Chia–Lin Chang, Sandeep Bagchi, Kevin Chen, Paul Ingersoll and Kuo–Tung Chang, A Novel Uniform–Channel–Program–Erase (UCPE) Flash EEPROM Using An Isolated P–well Structure, IEDM Tech. Digest, No. 33.5.1–33.5.4, Apr. 2000, pp. 779–782.

PCT/US02/30340 PCT Search Report mailed Mar. 7, 2003.

* cited by examiner

*Primary Examiner*—Fetsum Abraham

(57) ABSTRACT

An integrated NMOS circuit including an active stack having a plurality of isolated p-well active devices M1–M3, a bias stack having a plurality of diode-connected isolated p-well bias devices M4–M6, the gate of each of the plurality of diode-connected isolated p-well bias devices coupled to the gate of a corresponding one of the plurality of isolated p-well active devices, the bulk of each of the plurality of diode-connected isolated p-well bias devices coupled directly to the bulk of the corresponding one of the plurality of isolated p-well active devices, and the source of each of the plurality of diode-connected isolated p-well bias devices coupled directly to the bulk of the corresponding diode-connected isolated p-well bias device.

15 Claims, 6 Drawing Sheets

FIG. 1 — PRIOR ART —

NMOS CIRCUIT IN ISOLATED WELLS THAT ARE CONNECTED BY A BIAS STACK HAVING PLURALIRTY OF DIODE ELEMENTS

FIELD OF THE INVENTIONS

The present inventions relate generally to integrated circuits, and more particularly to bias schemes for active device stacks on MOS integrated circuits having low supply voltages.

BACKGROUND OF THE INVENTIONS

Stacked devices are used commonly on analog and RF integrated circuits (ICs) in both single-ended and differential embodiments. As the operating voltages of integrated circuits decrease with succeeding generations of process technology, however, the stacked devices must be biased optimally to maintain the devices in saturation and maximize signal-handling ability. Particularly, for proper operation of N stacked devices plus a current source, the minimum supply voltage, $V_{DD}$, must be N+1 times the gate-source voltage minus a threshold voltage plus a peak output signal swing, i.e., $V_{DD} \geq (N+1)(V_{GS}-V_T)+V_S$, where $V_{GS}$ is the gate-source voltage, $V_T$ is the effective threshold voltage and $V_S$ is the peak output signal swing. The gate-source voltage, $V_{GS}$, is typically 250 mV more than the effective threshold voltage, $V_T$, which is about 400 mV. The NMOS threshold voltage, $V_T = V_{TO}+g[\sqrt{(2Phi_F+V_{SB})}+\sqrt{(2Phi_F)}]$ (Equation 1), where $V_{TO}$ is the effective threshold voltage when the bulk and source are at the same potential, g is the bulk effect factor, $Phi_F$ is the absolute value of the Fermi potential, and $V_{SB}$ is the source-bulk voltage.

In a circuit having two stacked devices, for example, the supply voltage needs to be at least 0.75 V plus the peak signal swing, which is well within the maximum supply voltage of 1.8 V typical of present day ICs, but works only if the stacked devices are biased optimally.

A. R. Shahani et al. disclose a low threshold voltage process utilizing active common-mode feedback and resistor dividers to bias three stacked devices and a current source from a 1.5 V supply in "A 12-mW Wide Dynamic Range CMOS Front-End for a Portable GPS Receiver", IEEE Journal of Solid State Circuits, vol. 32, pp. 2061–2070, December 1997. The active common-mode feed back and resistor dividers of Shahani et al. however are relatively complex and require substantial area on the IC.

It is also known to bias a stack of circuit devices with a stack of diode-connected devices, which has the advantage of simplicity and small area on the IC. In the schematic diagram of Prior Art FIG. 1, the gate of each bias device M1–M3 is coupled to the gate of the corresponding active device M4–M6, respectively, in a single-ended embodiment but could represent a simplification of a differential embodiment. In FIG. 1, the bodies of the diode-connected bias devices M1–M3 and the bodies of the active devices M4–M6 are coupled to ground. In FIG. 1, the gate-source voltage, $V_{GS}$, increases at each level of the stack above the first level because the bulk of the devices are connected to ground. The circuit of FIG. 1 is biased less than optimally and requires a relatively high supply voltage due to the body effect, which is characterized by a voltage between the source and bulk of each device. The body effect causes an increase in the effective threshold voltage, $V_T$, according to Equation 1. In FIG. 1, the required minimum supply voltage $V_{DD}$ is the larger of $(N+1)_{VGS}$ for the bias stack or $(N+1)$ $V_{GS}-V_T'+V_S$ for the active stack and is more than the typical available supply voltage of 1.8 V, where $V_T'$ is $V_T$+deltV and $V_{GS}$, $V_T$ and $V_S$ are as defined above and deltV is the increase in threshold voltage caused by the body effect according to Equation 1.

The various aspects, features and advantages of the present invention will become more fully apparent to those having ordinary skill in the art upon careful consideration of the following Detailed Description of the Invention with the accompanying drawings described below.

DETAILED DESCRIPTION OF THE INVENTIONS

Figure 1:
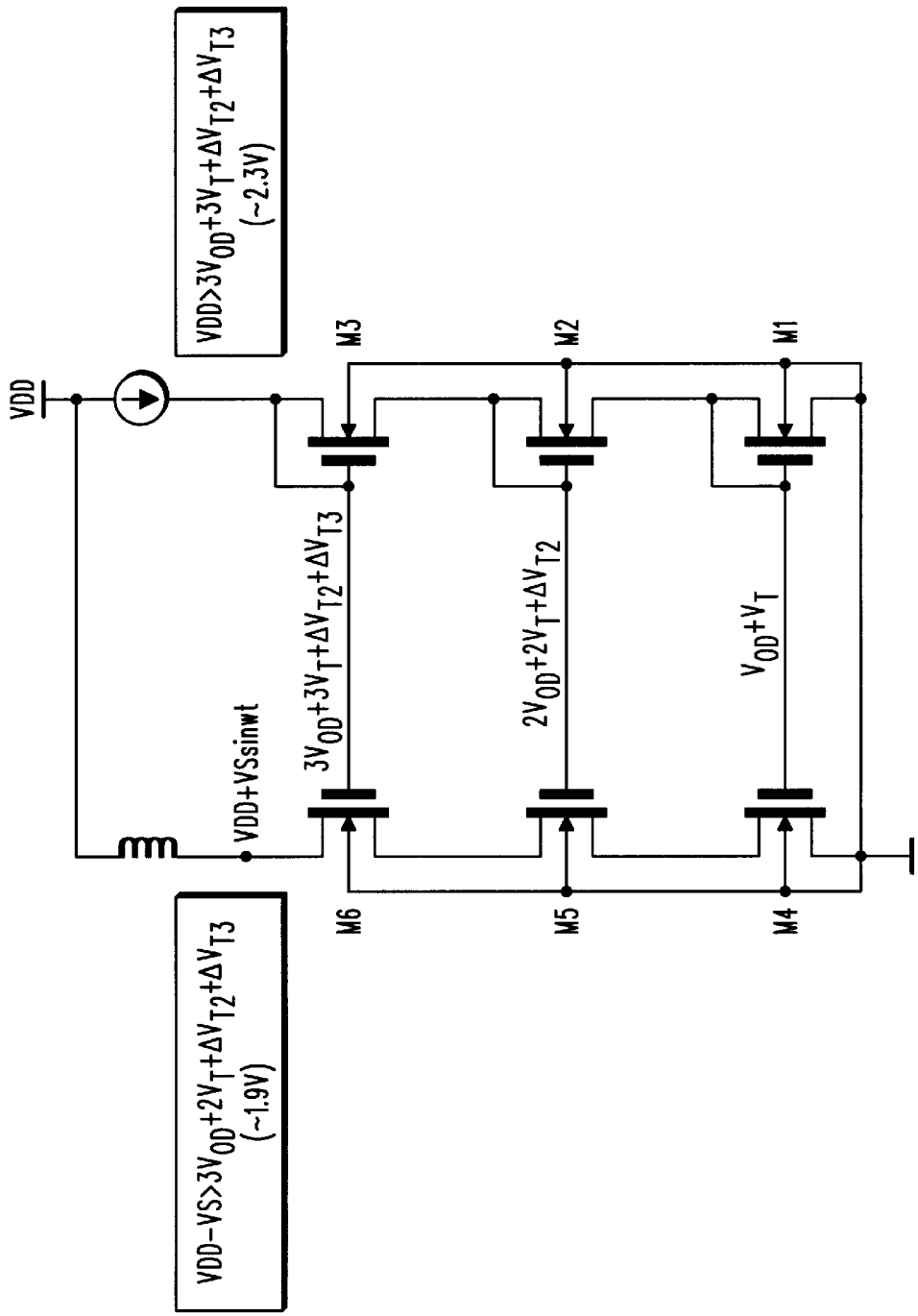
FIG. 1 is a prior art stacked of active devices biased with a stack of diode-connected devices.
Figure 2:
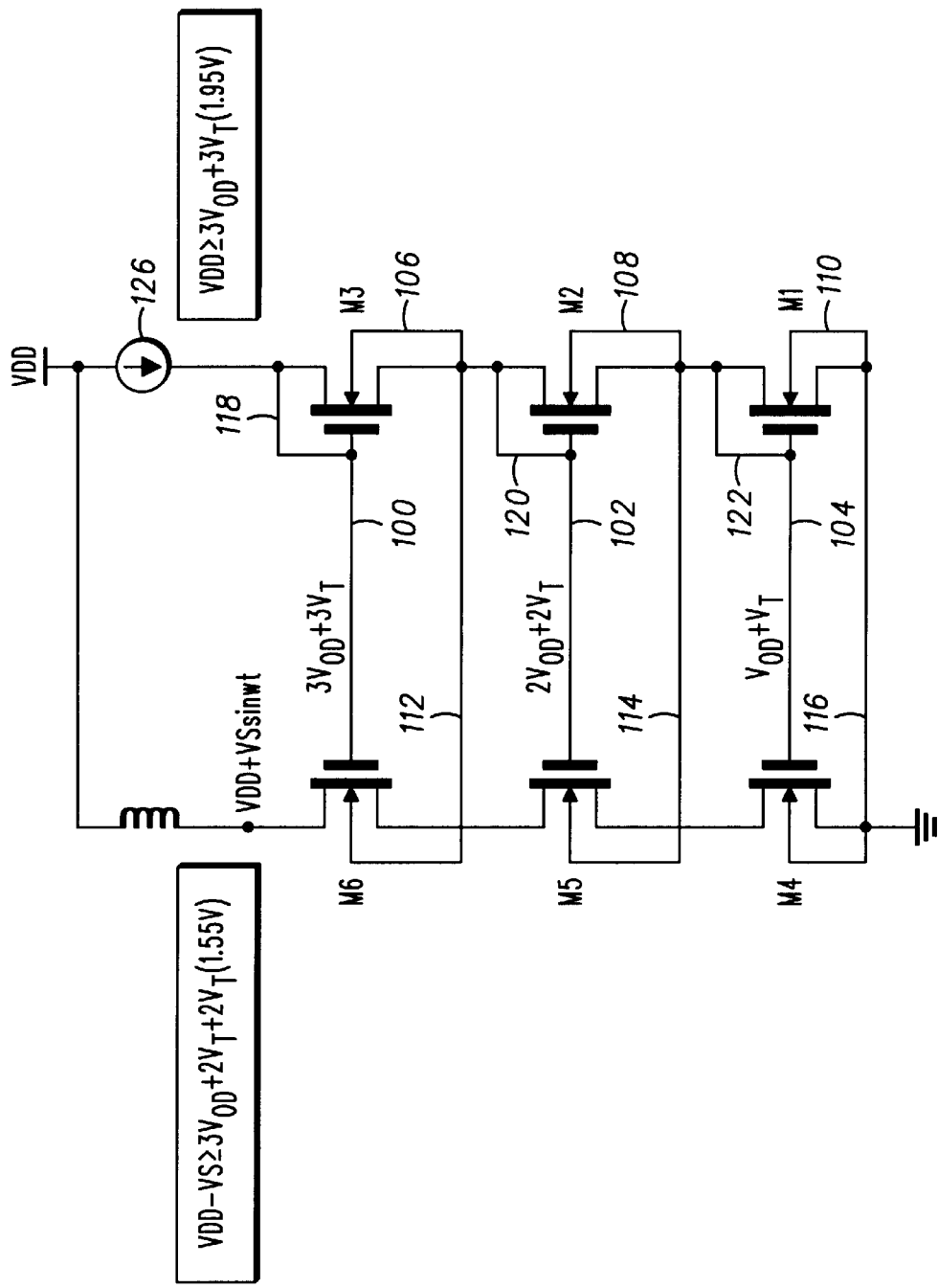
FIG. 2 is an exemplary integrated MOS stacked circuit device.
Figure 3:
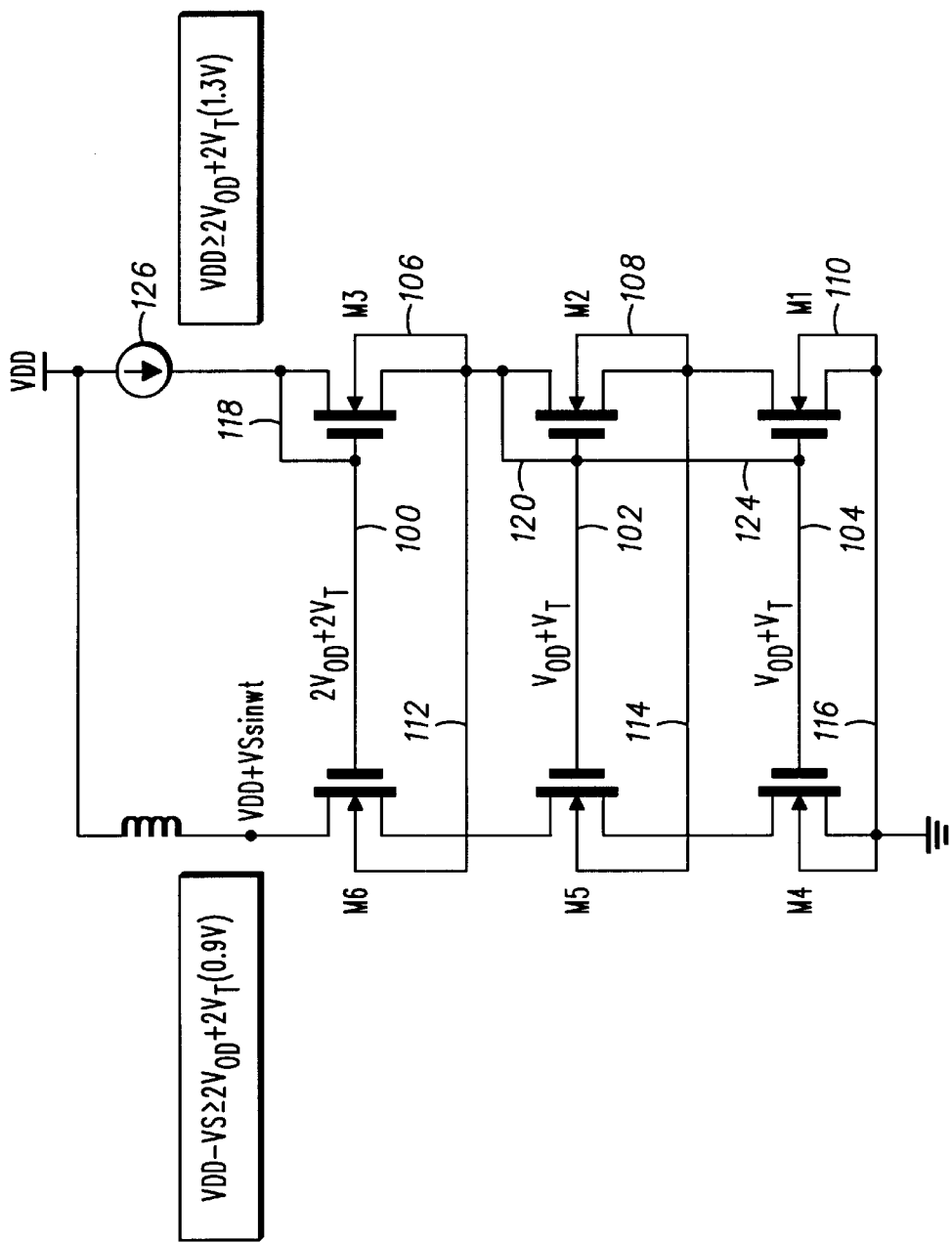
FIG. 3 is another exemplary integrated MOS stacked circuit device.

In FIGS. 2 and 3, an integrated NMOS circuit comprises generally an active stack having a plurality of active devices M4, M5 and M6, shown single-ended but could represent a simplification of a differential embodiment, and a bias stack with a corresponding plurality of diode-connected bias devices M1, M2 and M3. The circuit is configured for optimal bias and minimal supply voltage, $V_{DD}$, within the scope of the invention, as discussed more fully below.

In the exemplary embodiment, there are three stacked active device and three stacked bias devices, but in other embodiments there could be only two or more than three.

Figure 4:
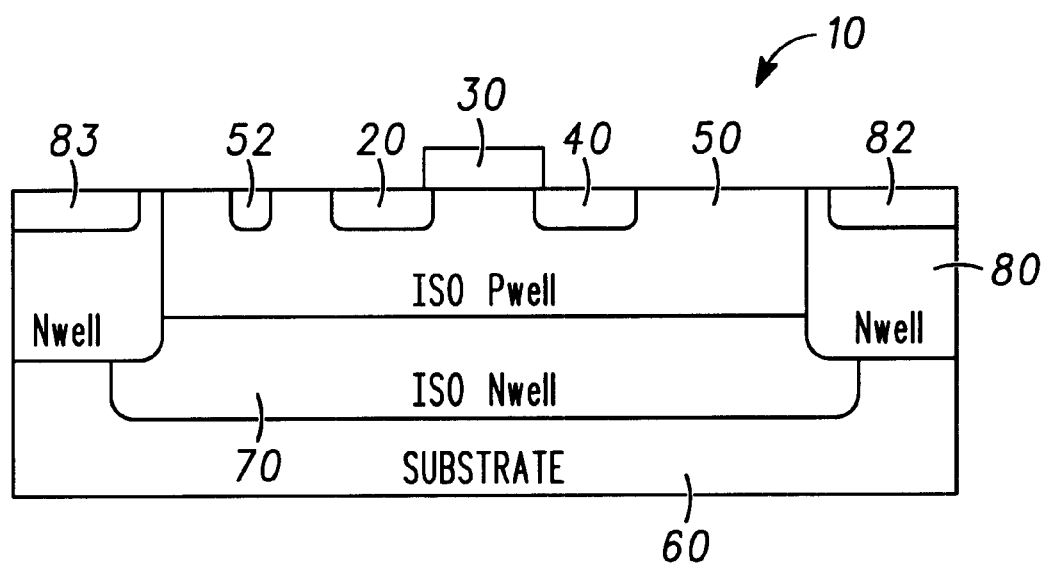
FIG. 4 is an exemplary isolated p-well device.

The devices of the active stack and the bias stack are preferably isolated p-well devices, which are fabricated with triple-well process technology known by those having ordinary skill in the art. FIG. 4 illustrates an isolated p-well device 10 comprising generally a source 20, a gate 30 and a drain 40 on an isolated p-well or, bulk, 50 having a contact 52. The bulk 50 is separated from a substrate 60 by an isolated Nwell 70 and a surrounding Nwell 80 having contacts 82 and 83.

In FIGS. 2 and 3, the gate of each of the plurality of diode-connected isolated p-well bias devices is coupled to the gate of a corresponding one of the plurality of isolated p-well active devices by a corresponding lead 100, 102 and 104, respectively. The exemplary coupling is direct, but more generally the coupling of the gates may be indirect, for example there may be passive or active circuit components therebetween.

The voltage between the source and bulk of each diode-connected isolated p-well bias device is reduced to zero by directly connecting the bulk of each diode-connected isolated p-well bias device to the source of the corresponding diode-connected isolated p-well bias device. In FIGS. 2 and 3, the direct connection between the bulk and the source of each device is made by a corresponding interconnection or lead 106, 108 and 110. The lead is part of the integrated circuit.

In FIGS. 2 and 3, the bulk of each of the plurality of diode-connected isolated p-well bias devices is coupled directly to the bulk of the corresponding one of the plurality of isolated p-well active devices by a corresponding lead 112, 114 and 116. This connection reduces parasitic capacitance. Alternatively, the bulk of each of the plurality of isolated p-well active devices is coupled to its source, but this alternative connection increases the parasitic capacitance on the sources versus coupling the bulk of the active device to the bulk of the corresponding bias device.

In FIGS. 2 and 3, a lowermost isolated p-well active device, M4, of the active stack is a current source.

In FIG. 2, a diode connection is made as follows: the drain of each of the plurality of diode-connected isolated p-well bias devices, M1, M2 and M2, is coupled directly to the corresponding gate of the diode-connected isolated p-well bias device by corresponding interconnection 118, 120 and 122.

In the exemplary embodiment of FIG. 3, the bottommost diode-connected isolated p-well bias device M1 of the bias stack has its gate coupled directly to the gate of a next higher diode-connected isolated p-well bias device M2 by interconnection 124, thereby providing the same voltage on the gates of the diode-connected isolated p-well bias devices M1 and M2, which reduces the minimum circuit supply voltage as discussed more fully below. The drain of each of the plurality of diode-connected isolated p-well bias devices, M2 and M3, other than the bottommost diode-connected isolated p-well bias device, M1, is coupled directly to the gate of the corresponding diode-connected isolated p-well bias device by corresponding interconnection 118 and 120.

In FIGS. 2, 3, 5 and 6 a current source 126 is coupled between the supply voltage and the bias stack. Also, the areas of the active devices are commonly larger than those of the corresponding bias stack devices to reduce the required magnitude of current source 126 by the ratio of areas.

In FIG. 2, on the active stack side, $V_{DD}-V_2 >= 3V_{OD}+2V_T$ (1.55V), where $V_{OD}=V_{GS}-V_T$. On the bias stack side, $V_{DD} >= 3V_{OD}+3V_T$ (1.95V), where $V_{OD}=V_{GS}-V_T$. If M1=M2=M3, $V_{OD}$ is the same for all of the diode-connected isolated p-well bias devices. For saturated operation, $V_{DS} >= V_{GS}-V_T=V_{OD}$, and in one embodiment $V_T=0.40V$ and $V_{OD}=0.25V$.

In FIG. 3, on the active stack side, $V_{DD}-V_S >= 2V_{OD}+V_T$ (0.90V), where $V_{OD}=V_{GS}-V_T$. On the bias stack side, $V_{DD} >= 2V_{OD}+2V_T$ (1.30V), where $V_{OD}=V_{GS}-V_T$. If the areas of M1=M2=M3, $V_{OD}$ is the same for all of the diode-connected isolated p-well bias devices. In FIG. 3, since $V_{GS1} > V_{GS2}$ for positive $V_{DS1}$, the area of $M_2 > M_1$. For saturated operation, $V_{DS} >= V_{GS}-V_T=V_{OD}$, and in one embodiment $V_T=0.40V$ and $V_{OD}=0.25V$.

Figure 5:
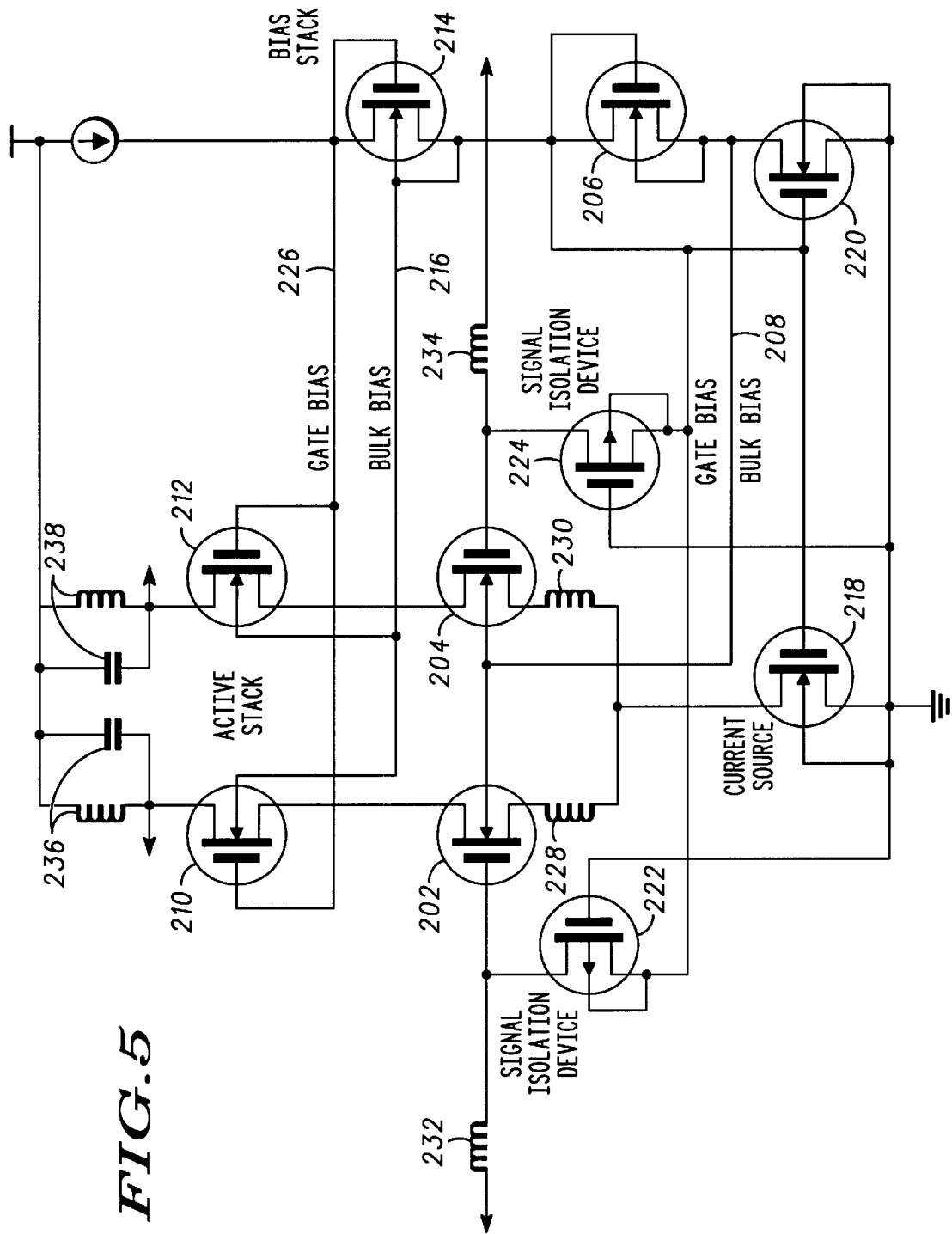
FIG. 5 is an exemplary low noise amplifier on an MOS integrated circuit.

FIG. 5 is an exemplary differential low noise amplifier on a MOS integrated circuit comprising generally an amplifier stack having a plurality of isolated p-well active devices and a bias stack having a plurality of diode-connected isolated p-well bias devices. In other embodiments, however, the active stack may be a mixer or op-Amp or some other device stack.

In FIG. 5, the gate of each of the plurality of isolated p-well active devices is coupled to the gate of at least one of the plurality of diode-connected isolated p-well devices, the bulk of each of the plurality of isolated p-well active devices is coupled to the bulk of at least one of the plurality of diode-connected isolated p-well devices, and the source of each of the plurality of diode-connected isolated p-well bias devices is coupled directly to the bulk of the corresponding diode-connected isolated p-well bias device.

In FIG. 5, the plurality of isolated p-well active devices comprises first and second isolated p-well active devices 202 and 204 having their bodies coupled to the bulk of a corresponding common diode-connected isolated p-well bias device 206 by interconnection 208. The plurality of isolated p-well active devices also comprises third and fourth isolated p-well active devices 210 and 212 having their gates coupled to the gate and their bodies coupled to the bulk of a corresponding common diode-connected isolated p-well bias device 214 by interconnection 216 and 226, respectively.

In FIG. 5, the drain of the first isolated p-well active device 202 is coupled to the source of the third isolated p-well active device 210, and the drain of the second isolated p-well active device 204 is coupled to the source of the fourth isolated p-well active device 212 forming what is commonly known as a cascode.

In FIG. 5, the drain of an isolated p-well current source 218 is coupled to the sources of the first and second isolated p-well active devices 202 and 204 through exemplary degenerating inductors 228 and 230. The isolated p-well current source 218 has its gate coupled to the gate of a corresponding diode-connected isolated p-well bias device 220 of the bias stack.

In FIG. 5, the gate of the diode-connected isolated p-well bias device 220, coupled to the gate of the isolated p-well current source 218, is coupled to the drain of a next higher diode-connected isolated p-well bias device 206 in the bias stack. The drain of each of the plurality of diode-connected isolated p-well bias devices 206 and 214, other than the diode-connected isolated p-well bias device 220 coupled to the isolated p-well current source, is coupled directly to the gate of the corresponding diode-connected isolated p-well bias device.

In FIG. 5, corresponding signal isolation devices 222 and 224 interconnect the gate of the first and second isolated p-well active devices 202 and 204 to the gate of the corresponding isolated p-well bias device 206. Each of the isolation devices 222 and 224 is a PMOS device having its gate coupled to ground to turn on the device. The signal isolation could just as well be accomplished with a passive device.

In FIG. 5, the input signal is applied across the gates of first and second isolated p-well active devices 202 and 204 through exemplary inductors 232 and 234.

In FIG. 5, the output signal is taken across the drains of the third and fourth isolated p-well active devices 210 and 212, which have corresponding exemplary loads 236 and 238 isolating the output signal from the positive supply (VDD) while at the same time coupling the DC voltage to the drains of active devices 210 and 212.

Figure 6:
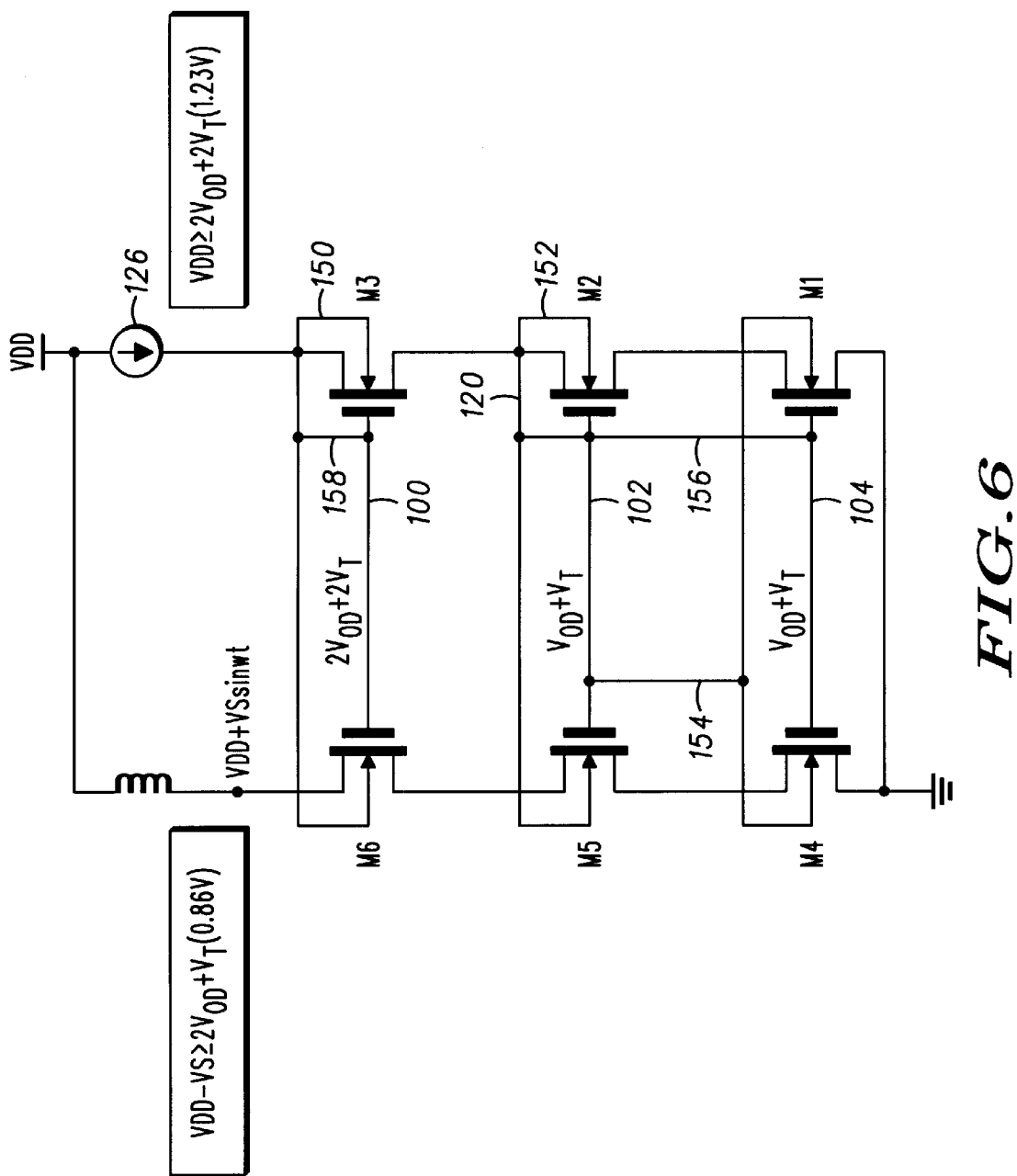
FIG. 6 is an alternative exemplary integrated MOS stacked circuit.

FIG. 6 is another alternative embodiment wherein the diode-connected isolated p-well bias devices have a forward bulk to source bias. In FIG. 6, the bulk of each of the-plurality of diode-connected isolated p-well bias devices is coupled directly to the bulk of the corresponding one of the plurality of isolated p-well active devices by interconnections 140, 142 and 144, respectively.

In FIG. 6, the gates of each active device and the corresponding bias device are coupled by interconnections 100, 102 and 104, respectively, as discussed above in the embodiment of FIG. 3.

The bulk to source forward bias in FIG. 6 is provided by directly coupling the drain of each of the plurality of diode-connected isolated p-well bias devices, except the lowermost diode-connected isolated p-well device of the bias stack, to the bulk of the corresponding diode-connected isolated p-well bias device by corresponding interconnection 150 and 152, respectively.

In FIG. 6, the bulk of the lowermost diode-connected isolated p-well bias device is coupled to the bulk of an adjacent diode-connected p-well bias device by interconnect 154, and the gate of the lowermost diode-connected isolated p-well bias device is coupled to the gate of the adjacent diode-connected isolated p-well bias device by interconnect 156. In FIG. 6, interconnects 158 and 159 interconnect the drain and gate of the two uppermost diode-connected isolated p-well devices, respectively, as discussed above.

In FIG. 6, the lowermost isolated p-well active device M4 of the active stack is a current source.

While the present inventions and what is considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the inventions, which are to be limited not by the exemplary embodiments but by the appended claims.

What is claimed is:

1. An integrated NMOS circuit, comprising:
   an active stack having a plurality of isolated p-well active devices, each isolated p-well active device having a gate and a bulk;
   a bias stack having a plurality of diode-connected isolated p-well bias devices, each of the plurality of diode-connected isolated p-well bias devices having a gate, a source, and a bulk,
   the gate of each of the plurality of diode-connected isolated p-well bias devices coupled to the gate of a corresponding one of the plurality of isolated p-well active devices,
   the bulk of each of the plurality of diode-connected isolated p-well bias devices coupled directly to the bulk of the corresponding one of the plurality of isolated p-well active devices,
   the source of each of the plurality of diode-connected isolated p-well bias devices coupled directly to the bulk of the corresponding diode-connected isolated p-well bias device.

2. The integrated circuit of claim 1, each of the plurality of diode-connected isolated p-well bias devices having a drain, the drain of each of the plurality of isolated p-well bias devices coupled directly to the gate of the corresponding diode-connected isolated p-well bias device.

3. The integrated circuit of claim 2, a lowermost isolated p-well active device of the active stack is a current source.

4. The integrated circuit of claim 1,
   each of the plurality of diode-connected isolated p-well bias devices having a drain,
   a bottommost diode-connected isolated p-well bias device of the bias stack having its gate coupled directly to the gate of a next higher diode-connected isolated p-well bias device of the bias stack,
   the drain of each of the plurality of diode-connected isolated p-well bias devices, other than the bottommost diode-connected isolated p-well bias device, coupled directly to the gate of the corresponding diode-connected isolated p-well bias device.

5. The integrated circuit of claim 4, a lowermost isolated p-well active device of the active stack is a current source.

6. A low noise amplifier on an NMOS integrated circuit, comprising:
   an active stack having a plurality of isolated p-well active devices, each of the plurality of isolated p-well devices having a gate and a bulk;
   a bias stack having a plurality of diode-connected isolated p-well bias devices, each of the plurality of diode-connected isolated p-well bias devices having a gate, a source, and a bulk,
   the gate of each of the plurality of isolated p-well active devices coupled to the gate of at least one of the plurality of diode-connected isolated p-well bias devices,
   the bulk of each of the plurality of isolated p-well active devices coupled to the bulk of at least one of the plurality of diode-connected isolated p-well bias devices,
   the source of each of the plurality of diode-connected isolated p-well bias devices coupled directly to the bulk of the corresponding diode-connected isolated p-well bias device.

7. The amplifier of claim 6,
   the plurality of isolated p-well active devices comprising first and second isolated p-well active devices having their bodies coupled to the bulk of a corresponding common diode-connected isolated p-well bias device,
   the plurality of isolated p-well active devices comprising third and fourth isolated p-well active devices having their gates coupled to the gate of a corresponding common diode-connected isolated p-well bias device,
   a drain of the first isolated p-well active device coupled to a source of the third isolated p-well active device, a drain of the second isolated p-well active device coupled to a source of the fourth isolated p-well active device.

8. The amplifier of claim 7, an isolated p-well current source coupled to the sources of the first and second isolated p-well active devices, the isolated p-well current source having a gate coupled to a gate of a corresponding diode-connected isolated p-well bias device of the bias stack.

9. The amplifier of claim 8,
   the gate of the diode-connected isolated p-well bias device, coupled to the gate of the isolated p-well current source, coupled to the drain of a next higher diode-connected isolated p-well bias device in the bias stack,
   the drain of each of the plurality of diode-connected isolated p-well bias devices, other than the diode-connected isolated p-well bias device coupled to the isolated p-well current source, coupled directly to the gate of the corresponding diode-connected isolated p-well bias device.

10. The amplifier of claim 9, corresponding isolation devices interconnecting the gate of the first and second isolated p-well active devices to the gate of the corresponding active isolated p-well device.

11. The amplifier of claim 10, each isolation device is a PMOS device having a gate coupled to ground.

12. An integrated NMOS circuit, comprising:
    an active stack having a plurality of isolated p-well active devices, each isolated p-well active device having a gate and a bulk;

a bias stack having a plurality of diode-connected isolated p-well bias devices, each of the plurality of diode-connected isolated p-well bias devices having a gate, a drain, and a bulk, the gate of each of the plurality of diode-connected isolated p-well bias devices coupled to the gate of a corresponding one of the plurality of isolated p-well active devices, the bulk of each of the plurality of diode-connected isolated p-well bias devices coupled directly to the bulk of the corresponding one of the plurality of isolated p-well active devices, the drain of each of the plurality of diode-connected isolated p-well bias devices, except a lowermost diode-connected isolated p-well device, coupled directly to the bulk of the corresponding diode-connected isolated p-well bias device.

13. The circuit of claim 12, the bulk of the lowermost diode-connected isolated p-well bias device coupled to the bulk of an adjacent diode-connected p-well bias device, the gate of the lowermost diode-connected isolated p-well bias device coupled to the gate of the adjacent diode-connected isolated p-well bias device.

14. The integrated circuit of claim 13, a lowermost isolated p-well active device of the active stack is a current source.

15. The integrated circuit of claim 12, a current source coupled between a supply voltage input and the bias stack.

* * * * *